US006375060B1

United States Patent
Silhavy

(10) Patent No.: US 6,375,060 B1
(45) Date of Patent: Apr. 23, 2002

(54) FLUXLESS SOLDER ATTACHMENT OF A MICROELECTRONIC CHIP TO A SUBSTRATE

(75) Inventor: Robert Edward Silhavy, Redondo Beach, CA (US)

(73) Assignee: The Boeing Company, Seattle, WA (US)

( * ) Notice: Subject to any disclaimer, the term of this patent is extended or adjusted under 35 U.S.C. 154(b) by 0 days.

(21) Appl. No.: 09/619,350

(22) Filed: Jul. 19, 2000

(51) Int. Cl.[7] ............................................... B23K 1/20
(52) U.S. Cl. ................................. 228/180.22; 228/205
(58) Field of Search ........................... 228/180.22, 223, 228/179.1, 214, 219, 254, 205; 438/613–617; 257/737–738; 361/767–768

(56) References Cited

U.S. PATENT DOCUMENTS

| 4,504,007 A | * | 3/1985 | Anderson, Jr. et al. |
| 4,632,295 A | * | 12/1986 | Brusic et al. |
| 4,919,729 A | * | 4/1990 | Elmgren et al. |
| 5,076,487 A | * | 12/1991 | Bandyopadhyay et al. |
| 5,249,733 A | * | 10/1993 | Brady et al. |
| 5,478,005 A | * | 12/1995 | Nguyen |
| 5,611,476 A | * | 3/1997 | Soderlund et al. |
| 5,668,058 A | * | 9/1997 | Tanioka et al. |
| 5,788,143 A | * | 8/1998 | Boyd et al. |
| 5,988,487 A | * | 11/1999 | MacKay et al. |
| 6,119,927 A | * | 9/2000 | Ramos et al. |
| 6,196,446 B1 | * | 3/2001 | Fang et al. |

* cited by examiner

Primary Examiner—Tom Dunn
Assistant Examiner—Jonathan Johnson

(57) ABSTRACT

A chip bonding location of a microelectronic chip is joined to a substrate bonding location of a substrate using a metallic solder in the absence of a flux. Surface contamination and oxide are first removed from the chip bonding location and from the substrate bonding location. The joining is accomplished by positioning the microelectronic chip and the substrate in a facing contact with the chip bonding location and the substrate bonding location in registry in a contact region. A heating element is disposed adjacent to and below the chip bonding location and the substrate bonding location to form an assembly. There is no flux present in the assembly in the contact region. The assembly is placed into an oven having a non-oxidizing environment. The chip bonding location and the substrate bonding location are joined by heating the assembly to a preheating temperature of less than a melting temperature of the solder, and thereafter reflowing the solder by locally heating the contact region to a reflow temperature of greater than the melting temperature of the solder using the heating element, permitting the solder in the contact region to melt for a reflow period of time above the melting temperature of the solder, and then cooling the contact region to a temperature below the melting temperature of the solder. The solder is melted for a short period of time, preferably about 30–100 seconds.

20 Claims, 2 Drawing Sheets

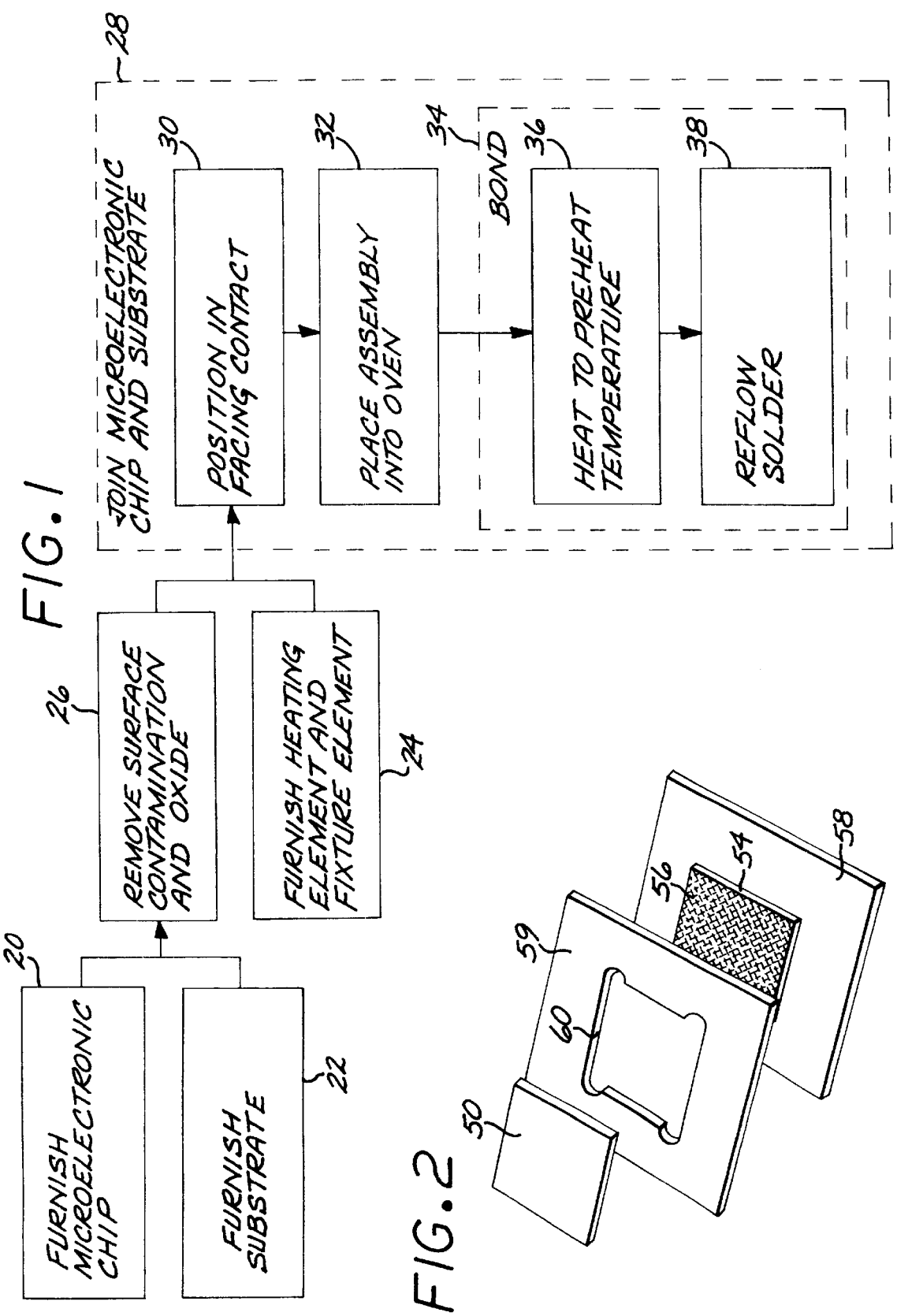

FLUXLESS SOLDER ATTACHMENT OF A MICROELECTRONIC CHIP TO A SUBSTRATE

This invention relates to microelectronic device structures and, more particularly, to the attachment of a microelectronic chip to a substrate using solder-bump technology.

BACKGROUND OF THE INVENTION

In one common architecture, a microelectronic chip is fabricated with large numbers of interconnected microelectronic circuits thereon. The microelectronic chip has input and output terminals of the microelectronic circuits on an external surface of the microelectronic chip. A conventional form of the terminals is solder bumps which protrude above the external surface of the microelectronic chip.

A number of the microelectronic chips and other electronic devices may be supported on a substrate. The substrate provides interconnection between the microelectronic chips and also serves as a structural support for the fragile microelectronic chips. The substrate is typically made of a single-layer of ceramic material with electrically conductive traces on its surface, or multiple layers of ceramic with electrically conductive traces on the various levels of the ceramic structure and vertical interconnects between the levels.

The microelectronic chip is attached to the substrate by affixing the solder bumps to the appropriate locations on the conductive traces of the substrate. The affixing is accomplished by fluxing the solder bumps and the traces, contacting the solder bumps to the traces in an oven which heats the solder to a temperature above its melting temperature to cause it to reflow, and then cooling the assembly to below the melting temperature of the solder. The flux is thereafter removed.

The inventor has recognized that the use of the flux may have adverse effects on the microelectronic chip itself. For example, where the microelectronic chip is based on silicon (Si) or gallium arsenide (GaAs) technology, the flux may contaminate the sensitive microcircuits. The flux residue may also result in environmental contamination. The inventor has recognized a need for a joining approach that overcomes these problems that arise from the use of flux-based solder joining of microelectronic chips to substrates. The present invention fulfills this need, and further provides related advantages.

SUMMARY OF THE INVENTION

The present invention provides a method for joining microelectronic chips to substrates that avoids the problems associated with conventional solder joining techniques that use a flux. The present approach may be used in a wide variety of applications which accomplish structural and electrical joining of the microelectronic chip to the substrate using a solder-bump or comparable technique. It is applicable to the mass production of microelectronic devices.

In accordance with the invention, a joining method comprises furnishing a microelectronic chip having a chip bonding location thereon, and furnishing a substrate having a substrate bonding location thereon. At least one of the chip bonding location and the substrate bonding location comprises a metallic solder. The chip bonding location is typically a solder bump, and the substrate bonding location is typically an electrically conductive metallic trace. A heating element, preferably a resistance heating element such as a graphite heating element, is furnished. Surface contamination and oxide are removed from the chip bonding location and from the substrate bonding location. Thereafter, the microelectronic chip is joined to the substrate. The step of joining includes positioning the microelectronic chip and the substrate in a facing contact with the chip bonding location and the substrate bonding location in registry in a contact region, and with the heating element disposed adjacent to the chip bonding location and the substrate bonding location to form an assembly. There is no flux present in the assembly in the contact region. The assembly is placed into an oven having a non-oxidizing environment, and the chip bonding location and the substrate bonding location are bonded together. The step of bonding includes the substeps of heating the assembly to a preheating temperature of less than a melting temperature of the solder, and thereafter reflowing the solder by locally heating the contact region to a reflow temperature of greater than the melting temperature of the solder using the heating element. The solder in the contact region is permitted to melt for a reflow period of time above the melting temperature of the solder, and then the contact region is cooled to a temperature below the melting temperature of the solder.

In a preferred application, the removal of surface contamination and oxide is accomplished by plasma cleaning at least one of the chip bonding location and the substrate bonding location, preferably both the chip bonding location and the substrate bonding location. An elapsed transition time between a completion of the step of removing and the commencement of the step of placing is preferably not more than about 30 minutes. The oven desirably has a vacuum, reducing gas, or inert gas environment. The reflow temperature is from about 30° C. to about 50° C. greater than the melting temperature of the solder, and the reflow period of time is from about 30 to about 100 seconds.

In one particularly preferred combination, the solder material has a composition in weight percent of about 97 percent lead and about 3 percent tin, the reflow temperature is from about 345° C. to about 360° C., and the reflow time is from about 30 to about 100 seconds.

The present approach does not utilize any flux in the contact region where the chip bonding location and the substrate bonding location meet. The use of the flux is avoided by the cleaning of this area, a transfer to the oven before there is a chance for the metallic surfaces to be re-contaminated or re-oxidized to any substantial degree, and a short reflow time above the melting temperature of the solder. The short reflow time is achieved by preheating the assembly just below the melting temperature of the solder, and then heating it above the melting temperature for a short time using the heating element. Because no flux is used, there is no risk of contamination of the sensitive portions of the microelectronic chip by flux and no need to clean flux from the structure after joining.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 1 is a block flow diagram of a preferred approach for practicing the invention;

FIG. 2 is a schematic exploded perspective view of a microelectronic chip during assembly to a substrate;

DETAILED DESCRIPTION OF THE INVENTION

FIG. 1 depicts a preferred joining method according to the invention. This method may be best understood by reference to FIGS. 2–4, which illustrate the components at various stages of the joining process. The assembly of elements is shown in exploded perspective view in FIG. 2, in elevational view just before the elements to be bonded are contacted in FIG. 3, and after bonding in FIG. 4.

A microelectronic chip 50 having a chip bonding location 52 thereon is furnished, numeral 20. The chip bonding location 52 is a metallic protrusion from the surface of the microelectronic chip 50. It serves as an electrical and structural interconnect.

Figure 3:
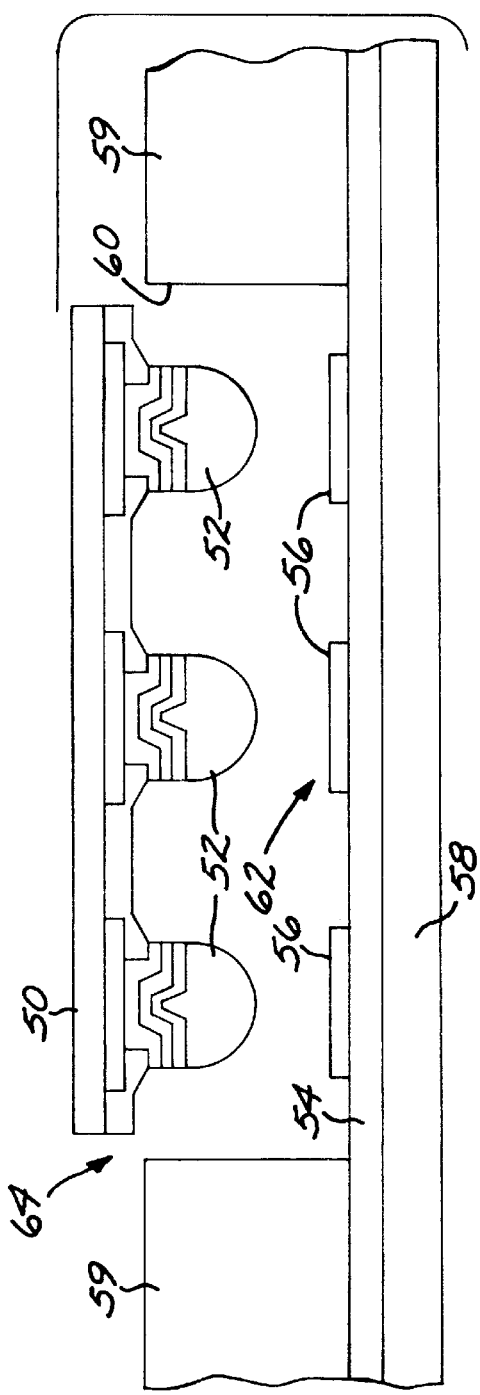
FIG. 3 is a schematic elevational view of the microelectronic chip and substrate of FIG. 2, prior to bonding.
Figure 4:
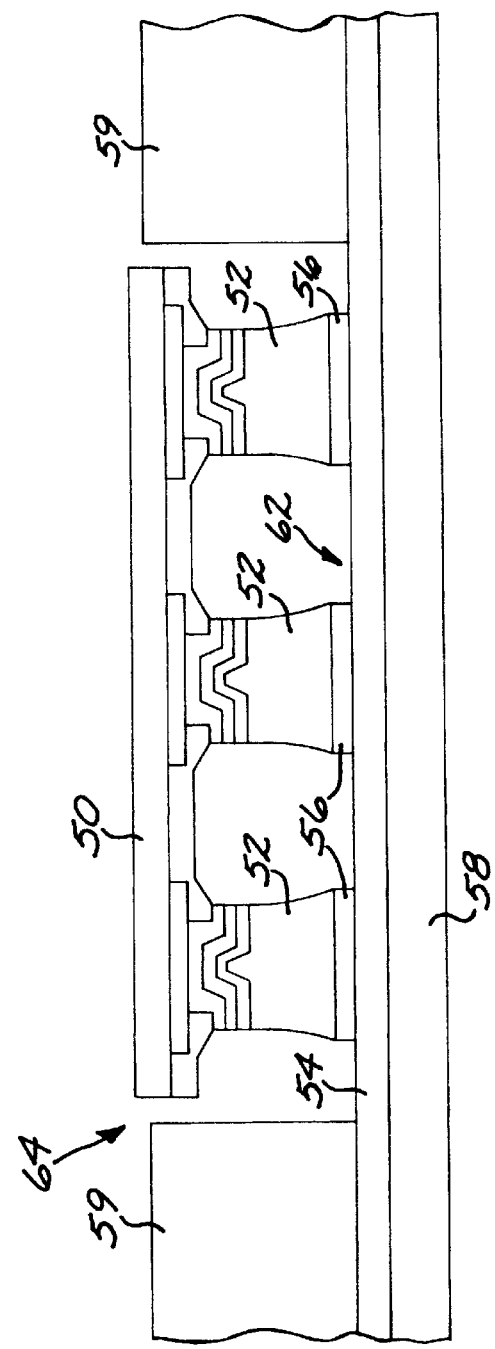
FIG. 4 is a schematic elevational view of the microelectronic chip and substrate of FIGS. 2 and 3, after bonding.

A substrate 54 having a substrate bonding location 56 thereon is furnished, numeral 22. The substrate 54 is preferably a ceramic. The substrate bonding location 56 is typically an electrically conductive strip (termed a "trace" in the art) which provides electrical interconnections on the substrate 54. In FIGS. 3–4, the substrate bonding locations 56 are viewed end-on, but they extend out of the plane of the illustration to other electronic components. The substrate bonding locations 56 are preferably formed by patterned deposition of a noble metal such as gold or platinum onto the surface of the substrate 54, and are sometimes termed "metallizations" after co-firing with the (ceramic) substrate.

There are usually multiple chip bonding locations 52 and substrate bonding locations 56, paired so as to form interconnections when respectively bonded together. At least one of the respective chip bonding location 52 and the substrate bonding location 56 comprises a metallic solder. In a typical case, only one of the chip bonding location 52 and the substrate bonding location 56, usually the chip bonding location 52, is made of a metallic solder. The chip bonding location 52 is preferably a solder bump, as shown in FIGS. 3–4, of a generally (but not necessarily exactly) hemispherical shape.

The solder may be of any operable type and composition. It is preferably a metallic alloy that melts at a sufficiently low temperature that its melting and reflowing does not damage the circuitry of the components. The preferred solder has a composition of about 97 weight percent lead and about 3 weight percent tin, which has a melting temperature of about 314–320° C.

The electronic structure of the microelectronic chip 50 and of the substrate 54 are specific to particular applications and are known in the art other than the improvements set forth herein. The microelectronic chip 50 is typically a patterned semiconductor material, and the substrate 54 is typically a ceramic. Examples of particular interest to the inventor are a silicon (Si) microelectronic chip 50, and an aluminum oxide or low-temperature cofired ceramic (LTCC) substrate 54.

A heating element 58 and a fixture element 59 are furnished, numeral 24. The heating element 58 may be of any operable type that provides heat locally. The heating element 58 is preferably a resistance heating element, and most preferably a graphite resistance heating element. The fixture element 59 has an aperture 60 therethrough which positions the microelectronic chip 50 in relation to the heating element 58, as illustrated in FIGS. 2–4. The fixture element 59 may also serve as a heating element. During assembly, the heating element 58 is positioned adjacent to the substrate 54, preferably just below and contacting the substrate 54 on its face opposite the microelectronic chip 50. When the microelectronic chip 50 is assembled to the substrate 54, it is received through the aperture 60, which aids in positioning and aligning the microelectronic chip 50 to the substrate 54 so that the chip bonding locations 52 are in spatial registry with the respective substrate bonding locations 56. In many applications, more than one microelectronic chip 50 is assembled to each substrate 54, and in this case there are provided multiple apertures 60 positioned so as to permit the various microelectronic chips 50 to be dropped into their proper locations over the respective regions of the substrate 54.

Before assembly, at least one, and preferably both, of the chip bonding location 52 and the substrate bonding location 56 is cleaned to remove surface contamination and oxides therefrom, numeral 26. The cleaning is preferably accomplished by plasma cleaning. In plasma cleaning, the article to be cleaned is placed into a plasma cleaning apparatus which generates a plasma adjacent to the surface of the article. The plasma cleaning apparatus uses a cleaning gas, such as argon, which does not chemically react with the surface of the article. In a typical case, a plasma power level of about 150 watts is generated in argon gas at a pressure of about 950 Torr. Argon cleaning is continued for a cleaning period of about 3 minutes.

The microelectronic chip 50 and the substrate 54 are joined, numeral 28. The step of joining 28 includes positioning the microelectronic chip 50 and the substrate 54 in a facing contact with the chip bonding location 52 and the substrate bonding location 56 in registry in a contact region 62, numeral 30, as illustrated in FIGS. 3–4. There is no soldering flux in this contact region 62. The present joining technique is fluxless. The heating element 58 is disposed adjacent to the chip bonding location 52 and the substrate bonding location 56 and thence to the contact region 62, forming an assembly 64.

The assembly 64 is placed into an oven having a non-oxidizing environment, numeral 32. The environment of the oven is preferably a vacuum, a reducing gas, or an inert gas. Where a vacuum is used, it is preferably at a pressure lower than about 350 millitorr. Examples of reducing gases are hydrogen and forming gas at a pressure of about 30 pounds per square inch (psi). Examples of inert gases are argon and nitrogen at a pressure of about 30 psi. As used herein an "inert" gas is one that does not chemically react with the microelectronic chip 50 or the substrate 54, and therefore both argon and nitrogen are considered inert gases.

The assembly 64 is desirably moved from the apparatus used in the removing step 26 to the controlled environment of the oven used in the placing step 32 as quickly as is practical in the circumstances. If the assembly 64 is allowed to remain in the open air, it may be attacked by corrosive agents and will certainly be oxidized. An elapsed transition time between a completion of the step of removing 26 and the commencement of the step of placing 32 is preferably not more than about 30 minutes in order to avoid unacceptable oxidation and/or corrosion of the microelectronic chip 50 and the substrate 54.

The chip bonding location 52 and the substrate bonding location 56 are bonded together, numeral 34. The step of bonding 34 includes the substeps of heating the assembly 64 to a preheating temperature of less than a melting temperature of the solder, numeral 36, preferably just slightly less than the melting temperature of the solder. The objective of this preheating is to equilibrate at a relatively uniform preheating temperate throughout the assembly 64 that is near to but not exceeding the melting temperature of the solder, a procedure termed "soaking" in the art. The preheat temperature is preferably no more than about 40° C. below the melting temperature of the solder. This relatively uniform temperature is conducive to the local heating of the next step. The equilibration is achieved in a "dwell time" at the preheating temperature. The dwell time is typically from about 1 to about 2 minutes.

The solder is thereafter reflowed, numeral 38, by locally heating the contact region 62 to a reflow temperature of greater than the melting temperature of the solder using the heating element 58. In the case of the preferred graphite resistance heating element 58, an electrical current is passed through the heating element 58, causing it to heat resistively. The contact region 62 is in turn heated by the heating element 58 to a reflow temperature above the melting point of the solder. The contact region 62 heats relatively quickly because of the close proximity of the heating element 58, the small thermal mass of the contact region 62, and the preheated state of the assembly 64. This heating is accomplished much more rapidly than possible by an oven alone or even by moving the assembly 64 to a different oven at the higher temperature, because of the thermal mass of the assembly 64. The solder in the contact region is permitted to melt for a reflow period of time at the reflow temperature above the melting temperature of the solder. Desirably, the reflow temperature is from about 30° C. to about 50° C. above the melting temperature of the solder, and the reflow period of time is no more than about 100 seconds. The contact region 62 is thereafter cooled relatively quickly to a temperature below the melting temperature of the solder and thence to lower temperatures, by discontinuing the current to the heating element 58 and thereafter removing the bonded structure from the oven.

In a case of interest to the inventor, the solder alloy has a composition in weight percent of about 97 percent lead and 3 percent tin. This solder alloy has a melting temperature of about 314–320° C. The preheating temperature is from about 280° C. to about 300° C., and the dwell time is about 1–2 minutes. The reflow temperature is from about 345° C. to about 360° C., and the reflow period of time is from about 30 to about 100 seconds. Heating from the preheating temperature to the reflow temperature, using the heating element 58, is accomplished in about 60 seconds. The final result is a well-bonded structure achieved without the use of a flux.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A joining method, comprising:
   furnishing a microelectronic chip having a chip bonding location thereon;
   furnishing a substrate having a substrate bonding location thereon, at least one of the chip bonding location and the substrate bonding location comprising a metallic solder;
   furnishing a heating element;
   removing surface contamination and oxide from the chip bonding location and from the substrate bonding location; thereafter
   joining the microelectronic chip and the substrate, the step of joining including the steps of
      positioning the microelectronic chip and the substrate in a facing contact with the chip bonding location and the substrate bonding location in registry in a contact region, and with the heating element disposed adjacent to the chip bonding location and the substrate bonding location to form an assembly, there being no flux present in the assembly in the contact region,
      placing the assembly into an oven having a non-oxidizing environment; and
      bonding the chip bonding location and the substrate bonding location, the step of bonding including the substeps of
         heating the assembly to a preheating temperature of less than a melting temperature of the solder, and thereafter
         reflowing the solder by locally heating the contact region to a reflow temperature of greater than the melting temperature of the solder using the heating element, permitting the solder in the contact region to melt for a reflow period of time above the melting temperature of the solder, and then cooling the contact region to a temperature below the melting temperature of the solder.

2. The method of claim 1, wherein the chip bonding location comprises a bump of the solder.

3. The method of claim 1, wherein the step of furnishing a heating element comprises the step of
   furnishing a resistance heating element.

4. The method of claim 1, wherein the step of furnishing a heating element comprises the step of
   furnishing a graphite resistance heating element.

5. The method of claim 1, wherein the step of removing includes the step of
   plasma cleaning at least one of the chip bonding location and the substrate bonding location.

6. The method of claim 1, wherein the step of removing includes the step of
   plasma cleaning the chip bonding location and the substrate bonding location.

7. The method of claim 1, wherein an elapsed transition time between a completion of the step of removing and the commencement of the step of placing is not more than about 30 minutes.

8. The method of claim 1, wherein the step of placing includes the step of
   placing the assembly into an oven having an environment selected from the group consisting of a vacuum, a reducing gas, and an inert gas.

9. The method of claim 1, wherein the reflow temperature is from about 30° C. to about 50° C. greater than the melting temperature of the solder.

10. The method of claim 1, wherein the reflow period of time is from about 30 to about 100 seconds.

11. The method of claim 1, wherein
    the solder material has a composition, in weight percent of about 97 percent lead and about 3 percent tin, the reflow temperature is from about 345° C. to about 360° C., and the reflow time is from about 30 to about 100 seconds.

12. A joining method, comprising:
    furnishing a microelectronic chip having a plurality of chip bumps thereon comprising a metallic solder;
    furnishing a substrate having a plurality of substrate metallizations thereon;

furnishing a resistance heating element;

plasma cleaning the chip bumps and the substrate metallizations; thereafter joining the microelectronic chip and the substrate, the step of joining including the steps of positioning the microelectronic chip and the substrate in a facing contact with the respective chip bumps and substrate metallizations in registry in a contact region, and with the heating element disposed adjacent to the chip bumps and the substrate metallizations to form an assembly, there being no flux present in the assembly in the contact region, placing the assembly into an oven having a non-oxidizing environment; and bonding the chip bumps and the substrate metallizations, the step of bonding including the substeps of generally heating the assembly to a preheating temperature of less than a melting temperature of the solder, and thereafter reflowing the solder by locally heating the contact region to a reflow temperature of greater than the melting temperature of the solder by passing an electrical current through the heating element, permitting the solder in the contact region to melt for a reflow period of time above the melting temperature of the solder, and then cooling the contact region to a temperature below the melting temperature of the solder by discontinuing the current to the heating element.

13. The method of claim 12, wherein an elapsed transition time between a completion of the step of removing and the commencement of the step of placing is not more than about 30 minutes.

14. The method of claim 12, wherein the step of placing includes the step of placing the assembly into an oven having an environment selected from the group consisting of a vacuum, a reducing gas, and an inert gas.

15. The method of claim 12, wherein the reflow temperature is from about 30° C. to about 50° C. greater than the melting temperature of the solder.

16. The method of claim 12, wherein the reflow period of time is from about 30 to about 100 seconds.

17. The method of claim 12, wherein the solder material has a composition, in weight percent of about 97 percent lead and about 3 percent tin, the reflow temperature is from about 345° C. to about 360° C., and the reflow time is from about 30 to about 100 seconds.

18. A joining method, comprising:

furnishing a microelectronic chip having a chip bonding location thereon;

furnishing a substrate having a substrate bonding location thereon, at least one of the chip bonding location and the substrate bonding location comprising a metallic solder;

removing surface contamination and oxide from the chip bonding location and from the substrate bonding location; thereafter joining the microelectronic chip and the substrate in a non-oxidizing environment, the step of joining including the steps of positioning the microelectronic chip and the substrate in a facing contact with the chip bonding location and the substrate bonding location in registry in a contact region to form an assembly, there being no flux present in the assembly in the contact region, heating the assembly to a preheating temperature of less than a melting temperature of the solder and equilibrating the assembly at the preheating temperature, and thereafter locally heating the contact region to a reflow temperature of greater than the melting temperature of the solder to reflow the solder, permitting the solder in the contact region to melt for a reflow period of time above the melting temperature of the solder, and then cooling the contact region to a temperature below the melting temperature of the solder.

19. The method of claim 18, wherein the step of locally heating includes the step of passing an electrical current through the contact region.

20. The method of claim 18, wherein the preheating temperature is no more than about 40° C. below the melting temperature of the solder.

\* \* \* \* \*